United States Patent
Chang et al.

(10) Patent No.: US 6,642,153 B1
(45) Date of Patent: Nov. 4, 2003

(54) METHOD FOR AVOIDING UNETCHED POLYMER RESIDUE IN ANISOTROPICALLY ETCHED SEMICONDUCTOR FEATURES

(75) Inventors: Chih-Fu Chang, Chiai (TW); Yu-Chun Huang, Hualien (TW)

(73) Assignee: Taiwan Semiconductor Manufacturing Co. Ltd, Hsin Chu (TW)

( * ) Notice: Subject to any disclaimer, the term of this patent is extended or adjusted under 35 U.S.C. 154(b) by 0 days.

(21) Appl. No.: 10/209,072

(22) Filed: Jul. 31, 2002

(51) Int. Cl.⁷ .................. H01L 21/4763; H01L 21/302; B08B 6/00

(52) U.S. Cl. .................. 438/725; 438/638; 438/706; 438/710; 134/1.1

(58) Field of Search .............................. 438/637–640, 438/706–709, 710, 714, 725, 783; 134/1.1–1.3

(56) References Cited

U.S. PATENT DOCUMENTS 6,174,796 B1 * 1/2001 Takagi et al.
6,319,815 B1 * 11/2001 Iguchi et al.
6,323,121 B1 * 11/2001 Liu et al.
6,380,073 B1 * 4/2002 Hwang et al.

* cited by examiner

Primary Examiner—Ha Tran Nguyen
(74) Attorney, Agent, or Firm—Tung & Associates

(57) ABSTRACT

A method for plasma treating an anisotropically etched semiconductor feature with improved removal of residual polymeric material including providing a semiconductor wafer having an anisotropically etched feature opening further including an edge portion defining a diameter of the anisotropically etched feature opening the anisotropically etched feature opening further comprising polymeric material disposed within the anisotropically etched feature opening; plasma treating the at least one opening with an oxygen containing plasma to substantially remove the polymeric material including removing a portion of the edge portion.

20 Claims, 2 Drawing Sheets

METHOD FOR AVOIDING UNETCHED POLYMER RESIDUE IN ANISOTROPICALLY ETCHED SEMICONDUCTOR FEATURES

FIELD OF THE INVENTION

The invention generally relates to multi-layered semiconductor structures and more particularly to a method for preventing or avoiding the presence of unetched polymer residues including photoresist remaining in anisotropically etched semiconductor features including trench line features formed in a dual damascene process.

BACKGROUND OF THE INVENTION

The escalating requirements for high density and performance associated with ultra large scale integration semiconductor wiring require increasingly sophisticated interconnection technology. As device sizes decrease it has been increasingly difficult to provide interconnection technology that satisfies the requirements of low resistance and capacitance interconnect properties, particularly where submicron inter-layer interconnects and intra-layer interconnects have increasingly high aspect ratios (e.g., an interconnect opening depth to diameter ratio of greater than about 4). In particular, high aspect ratio vias require uniform etching profiles including preventing necking or narrowing of the via opening which detrimentally affects design constraints for electrical resistance in semiconductor device functioning. Such necking or narrowing of the opening can detrimentally affect subsequent processes including adhesion/barrier layer deposition and metal filling deposition frequently resulting in degraded device function including electrical pathway open circuits.

In the fabrication of semiconductor devices, increased device density requires multiple layers, making necessary the provision of a multi-layered interconnect structure. Such a multi-layered interconnect structure typically includes intralayer conductive interconnects and inter-layer conductive interconnects formed by anisotropically etched openings in an insulating layer, often referred to an inter-metal dielectric (IMD) layer, which are subsequently filled with metal. Commonly used inter-layer high aspect ratio openings are commonly referred to as vias, for example, when the opening extends through an insulating layer between two conductive layers. The intra-layer interconnects extending horizontally in the IMD layer to interconnect different areas within an IMD layer are often referred to as trench lines. In one manufacturing approach, trench lines are formed overlying and encompassing one or more vias to form interconnects referred to as dual damascene structures.

In a typical process for forming multiple layer interconnect structure, for example, a dual damascene process, an insulating inter-metal dielectric (IMD) layer is deposited over a conductive area, for example a metallization layer frequently referred to as metal 1, metal 2, etc. depending on the number of preceding metallization layers. In one approach to forming a dual damascene structure, vias are first anisotropically etched through the IMD layer by conventional photolithographic and etching techniques. A second anisotropically etched opening referred to as a trench line is then formed according to a second photolithographic patterning process overlying and encompassing the via opening. The via opening and the trench line together makeup the dual damascene structure which is subsequently filled with metal, for example, copper, followed by a CMP planarization process to planarize the wafer process surface and prepare the process surface for formation of another layer or level in a multi-layered semiconductor device.

Signal transport speed is of great concern in the semiconductor processing art for obvious performance reasons. The signal transport speed of semiconductor circuitry, critically affected by the RC time constant of the multi-layer device, varies inversely with the product of resistance and capacitance (RC) of the interconnections. As integrated circuits become more complex and feature sizes decrease, the influence of the RC time constant on signal delay becomes greater.

One necessary approach to increasing signal transport speeds has been to reduce the dielectric constant of the dielectric insulating material used to form IMD layers thereby reducing the capacitance contribution of the IMD layer. Typical low-k (low dielectric constant) materials in use have included carbon doped silicon dioxide and other materials which tend to form a porous material thereby reducing the overall dielectric constant. Porous low-k materials have several drawbacks including enhanced absorption of chemical species by which may easily migrate throughout the IMD layer.

As feature sizes in anisotropic etching process have diminished, photolithographic patterning processes require activating light (radiation) of increasingly smaller wavelength. For 0.25 micron and below CMOS technology, deep ultraviolet (DUV) photoresists have become necessary to achieve the desired resolution. Typically DUV photoresists are activated with activating light source wavelengths of less than about 250 nm, for example, commonly used wavelengths include 193 nm and 248 nm. Many DUV photoresists are chemically amplified using a photoacid generator activated by the light source to make an exposed area soluble in the development process.

One problem affecting DUV photoresist processes is believed to be interference of residual nitrogen-containing species, for example amines, with the DUV photoresist. Residual nitrogen-containing contamination is one of the greater concerns in the use of metal nitride layers such as silicon oxynitride (e.g., SiON), which is commonly used as a bottom-anti-reflectance coating (BARC), also referred to as a dielectric anti-reflectance coating (DARC). Metal nitride layers, such as silicon oxynitride and silicon nitride are also frequently used as etching stop layers. The nitride layers are frequently formed by CVD processes using amine and amide containing precursors which tend to contaminate the near surface region of IMD layers. Low-k IMD layers typically having a high degree of porosity, facilitating absorption and transport of contaminating chemical species. For example, it is believed that nitrogen radicals, created during photolithographic patterning due to the presence of nitrogen containing species and absorbed into the IMD layer during metal nitride deposition, interfere with chemically amplified DUV photoresists by neutralizing a photogenerated acid catalyst which thereby renders the contaminated portion of the photoresist insoluble in the developer. As a result, residual photoresist remains on patterned feature edges, sidewalls, or floors of features, detrimentally affecting subsequent anisotropic etching profiles. During anisotropic etching of an overlying feature, for example a trench line opening overlying a via opening, residual photoresist remains or is redeposited on feature opening sidewalls. Consequently, necking, narrowing, or other undesirable etching profiles caused by polymeric residues remaining on feature sidewalls or floors following anisotropic etching, detrimentally affecting subsequent metal filling processes and leading to, for example, electrical open circuits or increased resistivity of interconnect features.

For example, referring to FIG. 1, is shown a dual damascene structure at a stage in manufacturing formed by a typical via-first dual damascene process, where the via opening 20A is first formed followed by forming a trench line opening 20B overlying and encompassing the via opening 20A. The dual damascene structure including the via opening 20A and the trench line opening 20B are formed over an underlying conductive area 12. The dual damascene structure is typically formed by at least two photolithographic patterning and reactive ion etching processes including first forming a via opening 20A followed by a forming the trench line opening 20B including anisotropically etching through a series of layers including for example a bottom anti-reflectance coating (BARC) layer 18; a second dielectric insulating layer 16B; a second etching stop layer 14B; a first dielectric insulating layer 16A; and finally, a first etching stop layer 14A.

As previously discussed, a serious problem with prior art processes for forming the dual damascene structure including forming the trench line opening according to an RIE process, is the formation of polymeric residues on feature sidewalls and floors, including what is referred to as a 'via fence' remaining at the trench line bottom portion e.g., 20C, surrounding the via opening 20A.

There is therefore a need in the semiconductor processing art to develop a method to reliably form anisotropically etched openings including dual damascene structures while avoiding the detrimental affect of polymeric residues remaining within anisotropically etched openings.

It is therefore an object of the invention to provide a method to reliably form anisotropically etched openings including dual damascene structures while avoiding the detrimental affect of polymeric residues remaining within anisotropically etched openings while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for plasma treating an anisotropically etched semiconductor feature with improved removal of residual polymeric material.

In a first embodiment, the method includes providing a semiconductor wafer having an anisotropically etched feature opening further including an edge portion defining a diameter of the anisotropically etched feature opening the anisotropically etched feature opening further comprising polymeric material disposed within the anisotropically etched feature opening; plasma treating the at least one opening with an oxygen containing plasma to substantially remove the polymeric material including removing a portion of the edge portion.

These and other embodiments, aspects and features of the invention will become better understood from a detailed description of the preferred embodiments of the invention which are described in conjunction with the accompanying drawings.

DETAILED DESCRIPTION OF THE PREFERRED EMBODIMENTS

Although the method of the present invention is explained by exemplary reference the formation of a via-first method of formation of a dual damascene structure in a multi-level semiconductor device, it will be appreciated that the method of the present invention is equally applicable to the anisotropic etching of other structures where one anisotropically etched opening is formed overlying and at least partially encompassing one or more other anisotropically etched openings where photoresist or polymeric residues remaining on features following a photolithographic patterning process and/or an anisotropic etching process is advantageously prevented by subjecting the features to an oxygen containing plasma treatment according to the present invention following an anisotropic etching step. While the method of the present invention is explained with exemplary reference to the formation of a copper filled dual damascene structure, it will be appreciated that the method is applicable where other metals, for example tungsten, aluminum, copper, or alloys thereof, are used to fill the dual damascene structure including the use of various types of adhesion/barrier liners.

Figure 1:
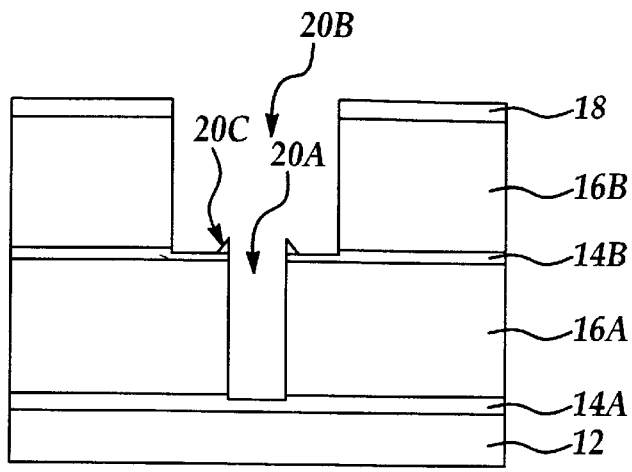
FIG. 1 is an exemplary cross sectional view of a dual damascene structure at a stage in manufacturing according to the prior art.

For example, in an exemplary embodiment, referring to FIGS. 2A–2F, are shown cross sectional side views of a portion of a multi-level semiconductor device at stages in a dual damascene manufacturing process. Referring to FIG. 1A is shown a conductive region 20, for example, copper, formed in a dielectric insulating layer (not shown) having an overlying first etching stop layer 22A, for example, silicon nitride (e.g., SiN) or silicon carbide (SiC). First etching stop layer 22A is formed by a conventional chemical vapor deposition (CVD) process including for example, LPCVD (low pressure CVD), having a thickness of about 300 Angstroms to about 700 Angstroms.

Figure 2A:
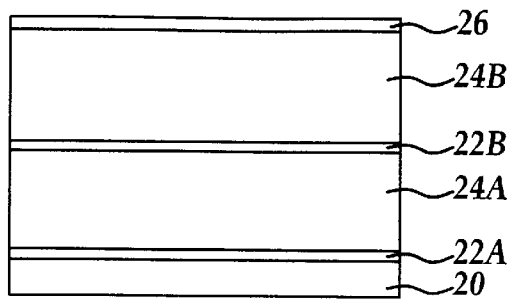
FIGS. 2A–2F are exemplary cross sectional views of a dual damascene structure stages in manufacturing process including the method according to an embodiment of the present invention.

Still referring to FIG. 2A, formed over etching stop layer 22A is first dielectric insulating layer 24A, also referred to as an inter-metal dielectric (IMD) or inter-layer dielectric (ILD) layer formed of, for example, fluorinated silicate glass (FSG) or a low-k (low dielectric constant) silicon oxide based material, e.g., carbon doped silicon dioxide, preferably having a dielectric constant of less than about 3.5. Typically, the IMD layer is formed having a thickness of about 3000 to about 7000 Angstroms.

Still referring to FIG. 2A, following deposition of the first IMD layer 24A, a second etching stop layer 22B is formed in a similar manner to first etching stop layer 22A, formed of, for example, silicon nitride (e.g., SiN) or silicon carbide (SiC) by, for example, an LPCVD process, having a thickness of about 300 Angstroms to about 600 Angstroms. Formed over second etching stop layer 22B is a second IMD layer 24B, also formed of, for example, fluorinated silicate glass (FSG) or a low-k (low dielectric constant) silicon oxide based material, e.g., carbon doped silicon dioxide, preferably having a dielectric constant of less than about 3.5. Typically, the second IMD layer is formed having a thickness about the same or slightly less than the first IMD layer. Formed over the second IMD layer 24B is a bottom anti-reflectance coating (BARC) layer 26 to reduce undesired light reflections from the second IMD layer surface during a photolithographic patterning process. For example, the BARC is formed of silicon oxynitride (e.g., SiON) in an LPCVD process to a thickness of about 1000 to about 1400 Angstroms.

Figure 2B:
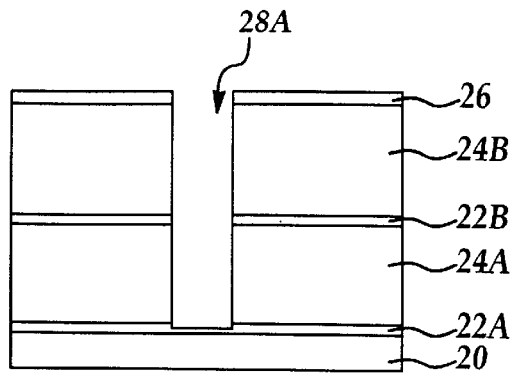

Referring to FIG. 2B, a via etching pattern is first formed according to a conventional photolithographic patterning process followed by a conventional anisotropic etching step to form via opening 28A. For example the anisotropic etching step includes sequential etching steps including conventional plasma etching chemistries formed of combinations of gases including hydrofluorocarbons, fluorocarbons, nitrogen, and oxygen to sequentially etch through the BARC layer 26, the second IMD layer 24B, the second etching stop layer 22B, the first IMD layer 24A, and partially through first etching stop layer 22A.

Figure 2C:
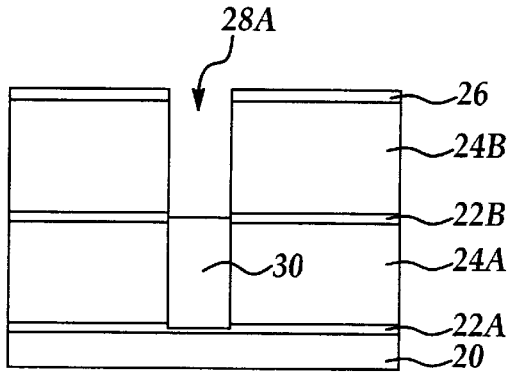

Referring to FIG. 2C, following anisotropically etching via opening 28A, a resinous material layer, such as an I-line photoresist, or novolac resin, is blanket deposited by a spin-coating process to fill via opening 28A followed a thermal and/or radiative curing process. An plasma etching chemistry including oxygen is then used to etchback the resinous material layer to form via plug 30 filling at least a portion of via opening 28A. Preferably, the resinous layer is etched back such that the via plug is formed to fill the via to a level about where a subsequently formed overlying trench line depth or bottom portion will reach, for example, at about the second etching stop layer 22B. The via plug 30 serves to protect via sidewalls during a subsequent trench line etching process and provides an etching endpoint detection means for the trench line etching process.

Figure 2D:
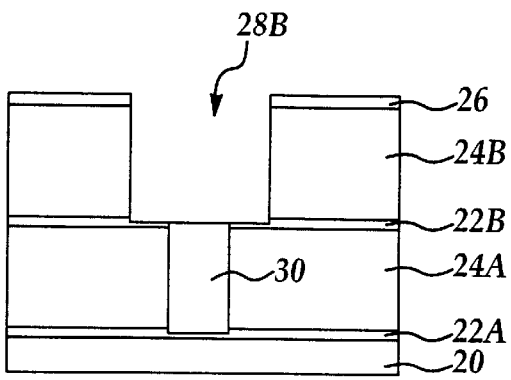

Referring to FIG. 2D, a second conventional photolithographic patterning process is then carried out to pattern a trench opening etching pattern overlying and encompassing via opening 28A. It will be appreciated that trench line openings may encompass more than one via opening. A conventional RIE process is then carried out to anisotropically etch trench opening 28B overlying and encompassing via opening 28A including at least partially etching through the second etching stop layer 22B.

According to the present invention an oxygen containing plasma treatment is then carried out to remove the via plug 30 and any remaining polymeric residues remaining within the dual damascene opening including polymeric residues surrounding via opening 28A, for example, at the level of the bottom portion of trench opening 28B. Preferably, the plasma is formed from an oxygen and additive gas mixture forming a plasma gas source mixture, the additive including at least one of helium, argon, and nitrogen. Nitrogen is preferably the additive based on better etching properties. More preferably, the plasma is formed from a plasma source gas mixture having a volume composition ratio of additive gas to oxygen of about 1:1 to about 10:1 respectively, the volume composition ratios indicating a relative volume composition of additive gas to oxygen with respect to the total volume of the plasma source gas mixture. For example, as will be appreciated, the preferred volume composition ratios may be achieved by adjusting the relative gas feed rates of individually supplied oxygen and nitrogen to correspond to the volume composition ratios of additive gas to oxygen of about 1 to 1 to about 10 to 1, respectively. Nitrogen is preferred as the additive gas since it is better able to etch nitrogen containing etching stop layers, for example silicon nitride.

The plasma process for carrying out the oxygen containing plasma treatment may include any conventional plasma reactor configuration and plasma source including high density, medium density and low density plasmas. For example, for a high density plasma (HDP), the plasma source may include an electron-cyclotron-resonance (ECR) source, a helicon plasma source, an inductively coupled plasma (ICP) source, a dual plasma source (DPS), or a magnetically enhanced RIE (MERIE).

Exemplary, preferred processing conditions for the oxygen containing plasma treatment include a plasma reactor chamber pressure of about 1 milliTorr to about 50 milliTorr, more preferably about 15 milliTorr to about 30 milliTorr. An RF power is preferably supplied to form and maintain the plasma between about 50 Watts to about 500 Watts. The oxygen containing plasma treatment is carried out for a period of about 10 seconds to about 60 seconds at a temperature of about 0° C. to about 80° C., more preferably from about 10° C. to about 60° C.

Figure 2E:
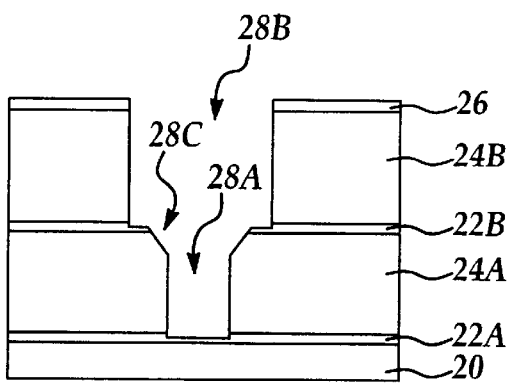

Referring to FIG. 2E, in one embodiment of the invention the oxygen containing plasma treatment is carried out for a sufficient period of time to substantially remove any remaining polymeric residue remaining in the dual damascene opening including polymeric residues surrounding an upper portion of the via opening 28A also referred to as 'via fences'. By the term 'substantially' is meant that about 90 percent or more of the opening surface portion includes less than about 5 percent polymer residue. For example, according to an exemplary embodiment of the present invention it has been found that in order to substantially remove polymeric residues according to the oxygen containing plasma treatment a portion of etching stop layer 22B and the upper portion of via opening 28A is partially etched, for example as shown at 28C, to form at least a partially rounded or faceted upper via opening edge portion. Preferably, the edge portion defining the via opening is greater in diameter compared to a via bottom portion by about 10 percent to about 30 percent. This is in contrast to an hour-glass shaped feature where the transition from the bottom portion to the upper portion of the feature is about constant. Preferably, the larger diameter of the via opening edge portion at an upper portion of the via includes at most, an upper one-third of the via opening depth.

It has been found, however, according to exemplary embodiments of the present invention that the partially rounded or faceted upper via opening edge portion has no detrimental effect on electrical performance, rather electrical performance is improved compared to electrical degradation caused by polymeric residues. Various process wafer performance testing and benchmarks assessed following exemplary implementation of the present invention in a 0.13 micron process showed results well within acceptable parameters. For example, process wafer performance testing and benchmarks well known in the art including electromigration (EM) wafer acceptance testing (WAT), and yield were well within acceptable parameters following exemplary implementation of the present invention.

Figure 2F:
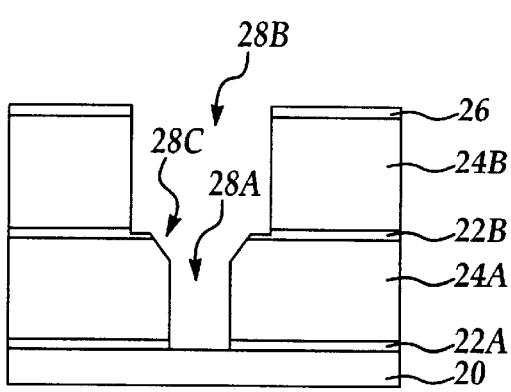

Referring to FIG. 2F, following the oxygen containing plasma treatment of the dual damascene structure to remove residual polymeric material, a remaining portion of first etching top layer 22A is removed by a conventional RIE process to reveal the underlying conductive area 20. Although not shown, the dual damascene structure is then completed according to conventional processes. For example, the dual damascene opening is filled with metal, for example, a copper filling according to an electrodeposition process followed by a CMP process to remove excess copper above the trench opening to complete the formation of a dual damascene. Prior to electrodeposition of copper, a barrier/adhesion layer of for example, tantalum nitride, is blanket deposited to line the dual damascene structure, followed by deposition of a copper seed layer to provide an electrodeposition surface. During the subsequent CMP process the process surface is planarized above the trench line opening to complete the formation of the dual damascene structure.

Figure 3:
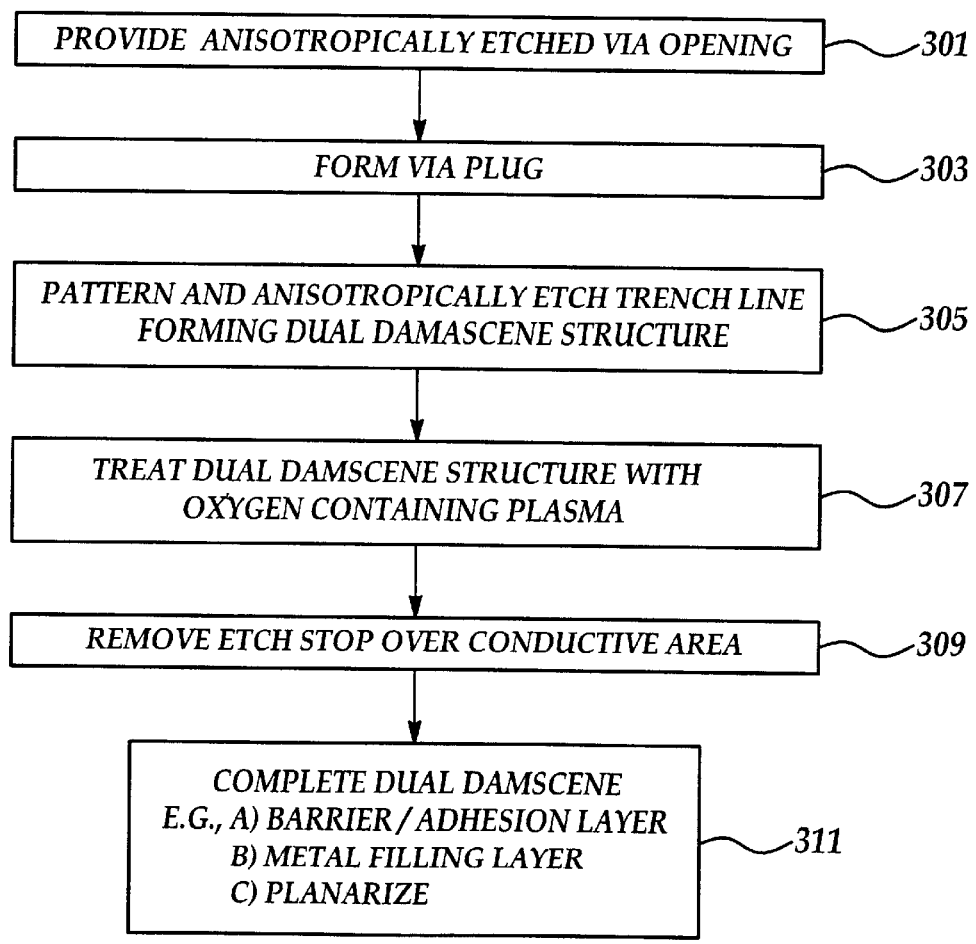
FIG. 3 is a process flow diagram including several embodiments of the method of the present invention.

Referring to FIG. 3 is shown a process flow diagram including several embodiments of the present invention. In process 301, a semiconductor wafer comprising a via opening is provided. In process 303, a polymeric via plug is formed to at least partially fill the via opening. In process 305, a photolithographic patterning and anisotropic etching process is carried out to form a trench line opening overlying and encompassing the via opening to form a dual damascene structure. In process 307 an oxygen containing plasma treatment is carried out including at least one additive gas, e.g., $N_2$, Ar, He, preferably $N_2$ gas, to remove the remaining polymeric via plug and substantially remove remaining polymeric residue to form at least partially rounded or faceted edges defining the via opening edge portion at about the trench line opening bottom portion level. In process 309, the dual damascene opening is completed by removing a remaining portion of the etching stop layer over the conductive area. In process 311, a several conventional processes are carried out to complete the dual damascene including a barrier/adhesion layer deposition step, a metal filling deposition step and a planarization process.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for plasma treating a resinous plug containing dual damascene opening with improved removal of polymeric material including residual via fences comprising the steps of:

providing a semiconductor wafer comprising a via opening extending through at least one IMD layer in closed communication with an underlying etch stop layer further comprising a resinous via plug formed to fill the via opening to a level about equal to a bottom portion of a subsequently formed overlying trench line opening;

etching the trench line opening overlying and encompassing the via opening to form a dual damascene opening comprising an edge portion defining a diameter of a remaining portion of the via opening; and, plasma treating the dual damascene opening with an oxygen containing plasma to substantially remove the resinous via plug including residual polymeric material while simultaneously removing a portion of the edge portion to form a faceted via opening portion having a larger diameter at an upper portion of the via opening.

2. The method of claim 1, wherein the oxygen containing plasma further comprises an additive including at least one of helium, nitrogen, and argon.

3. The method of claim 2, wherein the step of plasma treating further comprises forming the oxygen containing plasma from a plasma source gas comprising a volumetric ratio of the additive to the oxygen of about 1 to 1 to about 10 to 1 with respect to the total volume of the plasma source gas.

4. The method of claim 3 wherein the step of plasma treating further comprises applying an RF power of between about 50 Watts and about 500 Watts for a period of about 10 seconds to about 60 seconds at a pressure of about 1 milliTorr to about 50 milliTorr.

5. The method of claim 4, wherein the semiconductor wafer is maintained at a temperature of between about 0 degrees Centigrade and about 80 degrees Centigrade.

6. The method of claim 1, wherein the at least one IMD layer comprises at least one of fluorinated silicate glass (FSG) and carbon doped silicon dioxide.

7. The method of claim 1, wherein the oxygen containing plasma comprises oxygen and nitrogen.

8. The method of claim 1, wherein the upper portion comprises up to about ⅓ of the via opening depth.

9. The method of claim 1, wherein the at least one IMD layer comprises two IMD layers separated by a second silicon nitride etch stop layer for stopping the step of etching the trench line opening.

10. A method for plasma treating a dual damascene opening for improved removal of residual polymeric material comprising the steps of:

providing a semiconductor wafer comprising a via opening extending through at least one IMD layer to form closed communication with an etch stop layer overlying a conductive region;

forming a plug of polymeric resin according to a spin coating and etchback process to at least partially fill the via opening;

etching a trench line opening overlying and encompassing the via opening to form a dual damascene opening;

plasma treating the dual damascene opening with a plasma formed from a plasma source gas comprising oxygen to substantially remove the plug and residual polymeric material from the dual damascene opening including removing a portion of a via opening edge portion defining the via opening to form a larger diameter via opening in an upper via opening portion while leaving at least a portion of the etch stop layer in place; and, etching through a remaining portion of the etch stop layer to form closed communication with the underlying conductive region.

11. The method of claim 10, wherein the plasma source gas further comprises an additive including at least one of helium, nitrogen, and argon.

12. The method of claim 11, wherein the plasma source gas comprises a volumetric ratio of the additive to the oxygen of about 1 to 1 to about 10 to 1 with respect to the total volume of the plasma source gas.

13. The method of claim 12, wherein the step of plasma treating further comprises applying an RF power of between about 50 Watts and about 500 Watts for a period of about 10 seconds to about 60 seconds at a pressure of about 1 milliTorr to about 50 milliTorr.

14. The method of claim 13, wherein the semiconductor wafer is maintained at a temperature of between about 0 degrees Centigrade and about 80 degrees Centigrade.

15. The method of claim 11, wherein the at least one IMD layer comprises at least one of fluorinated silicate glass (FSG) and carbon doped silicon dioxide.

16. The method of claim 15, wherein the step of etching a trench line opening comprises stopping the trench line opening etching process at a second etch stop layer comprising silicon nitride provided to separate two IMD layers comprising the at least one IMD layer.

17. The method of claim 10, wherein the plasma source gas further consists essentially of oxygen and nitrogen.

18. The method of claim 10, wherein the step of forming a plug of polymeric resin comprises forming the plug to fill the via opening to a level about equal to a bottom portion of the trench line opening.

19. The method of claim 10, wherein removing a portion of the via opening edge portion produces a via opening diameter greater than a via opening bottom portion by about 10percent to about 30 percent.

20. The method of claim 19, wherein the via opening diameter is greater over at most about the upper ⅓ of the via opening.

* * * * *